(12) United States Patent
Negley et al.

(10) Patent No.: US 7,868,343 B2
(45) Date of Patent: Jan. 11, 2011

(54) LIGHT-EMITTING DEVICES HAVING MULTIPLE ENCAPSULATION LAYERS WITH AT LEAST ONE OF THE ENCAPSULATION LAYERS INCLUDING NANOPARTICLES AND METHODS OF FORMING THE SAME

(75) Inventors: Gerald H. Negley, Carrboro, NC (US); Eric Tarsa, Goleta, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/818,912

(22) Filed: Apr. 6, 2004

(65) Prior Publication Data

US 2005/0224829 A1    Oct. 13, 2005

(51) Int. Cl.
*H01L 27/15* (2006.01)
*H01L 29/22* (2006.01)

(52) U.S. Cl. .................... 257/99; 257/79; 257/100; 438/22

(58) Field of Classification Search .................. 257/99, 257/100, 81, E33.059, 79; 313/512; 438/22
See application file for complete search history.

(56) References Cited

U.S. PATENT DOCUMENTS

| | | | |
|---|---|---|---|
| 4,918,497 A | 4/1990 | Edmond | 357/17 |
| 4,966,862 A | 10/1990 | Edmond | 437/100 |
| 5,027,168 A | 6/1991 | Edmond | 357/17 |
| 5,210,051 A | 5/1993 | Carter, Jr. | 437/107 |
| 5,338,994 A | 8/1994 | Lezan et al. | 307/86 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,631,190 A | 5/1997 | Negley | 438/33 |
| 5,739,554 A | 4/1998 | Edmond et al. | 257/103 |
| 5,912,477 A | 6/1999 | Negley | 257/95 |
| 6,120,600 A | 9/2000 | Edmond et al. | 117/89 |
| 6,132,072 A | 10/2000 | Turnbull et al. | 362/494 |
| 6,187,606 B1 | 2/2001 | Edmond et al. | 438/46 |
| 6,201,262 B1 | 3/2001 | Edmond et al. | 257/77 |
| 6,245,259 B1* | 6/2001 | Hohn et al. | 252/301.36 |
| 6,717,362 B1* | 4/2004 | Lee et al. | 313/512 |

(Continued)

FOREIGN PATENT DOCUMENTS

EP    0 961 525    12/1999

(Continued)

OTHER PUBLICATIONS

International Search Report and The Written Opinion of the International Searching Authority for International Patent Application No. PCT/US/2005/011592 mailed on Sep. 23, 2005.

*Primary Examiner*—Kenneth A Parker
*Assistant Examiner*—Joseph Nguyen
(74) *Attorney, Agent, or Firm*—Myers Bigel Sibley & Sajovec

(57) ABSTRACT

A light-emitting device includes an active region that is configured to emit light responsive to a voltage applied thereto. A first encapsulation layer at least partially encapsulates the active region and includes a matrix material and nanoparticles, which modify at least one physical property of the first encapsulation layer. A second encapsulation layer at least partially encapsulates the first encapsulation layer.

27 Claims, 4 Drawing Sheets

U.S. PATENT DOCUMENTS

| | | |
|---|---|---|
| 6,958,497 B2 | 10/2005 | Emerson et al. |
| 2001/0002049 A1* | 5/2001 | Reeh et al. ................. 257/103 |
| 2002/0123164 A1 | 9/2002 | Slater, Jr. et al. .............. 438/39 |
| 2003/0117068 A1 | 6/2003 | Forrest et al. |
| 2003/0122482 A1 | 7/2003 | Yamanaka et al. |
| 2004/0004434 A1 | 1/2004 | Nishi et al. |
| 2004/0056260 A1 | 3/2004 | Slater, Jr. et al. .............. 257/79 |
| 2004/0217364 A1* | 11/2004 | Tarsa et al. .................... 257/89 |

FOREIGN PATENT DOCUMENTS

WO     WO 99/03087     1/1999

* cited by examiner

LIGHT-EMITTING DEVICES HAVING MULTIPLE ENCAPSULATION LAYERS WITH AT LEAST ONE OF THE ENCAPSULATION LAYERS INCLUDING NANOPARTICLES AND METHODS OF FORMING THE SAME

FIELD OF THE INVENTION

The present invention relates generally to microelectronic devices and fabrication methods therefor, and, more particularly, to light-emitting devices and fabrication methods therefor.

BACKGROUND OF THE INVENTION

Light-emitting diodes (LEDs) are widely used in consumer and commercial applications. As is well known to those skilled in the art, a light-emitting diode generally includes an active region on a microelectronic substrate. The microelectronic substrate may comprise, for example, gallium arsenide, gallium phosphide, alloys thereof, silicon carbide, and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with well entrenched incandescent and/or fluorescent lamps.

Standard LED packaging typically comprises an epoxy-based encapsulation layer to both protect the active device from the elements and to enhance the optical output of the LED dice. Unfortunately, an epoxy-based encapsulation layer may optically degrade when used with relatively short wavelength (e.g., 525 nm), high flux LEDs.

SUMMARY OF THE INVENTION

According to some embodiments of the present invention, a light-emitting device includes an active region that is configured to emit light responsive to a voltage applied thereto. A first encapsulation layer at least partially encapsulates the active region and includes a matrix material and nanoparticles, which modify at least one physical property of the first encapsulation layer. A second encapsulation layer at least partially encapsulates the first encapsulation layer.

In other embodiments of the present invention, the matrix material comprises silicone, a silicone compound, an optical gel, epoxy resin, glass, sol-gel, aerogel, and/or an optically stable polymer.

In still other embodiments of the present invention, the first encapsulation layer is substantially transparent.

In still other embodiments of the present invention, the nanoparticles comprise $TiO_2$, diamond, silicon carbide, scattering particles, fillers, phosphors, and/or light conversion materials.

In still other embodiments of the present invention, the at least one physical property comprises index of refraction, thermal conductivity, mechanical strength, abrasion resistance, and/or optical stability.

In further embodiments of the present invention, the matrix material is a first matrix material, and the nanoparticles are first nanoparticles. The second encapsulation layer comprises a second matrix material and second nanoparticles that modify at least one physical property of the second encapsulation layer.

In still further embodiments of the present invention, the second matrix material comprises silicone, a silicone compound, an optical gel, epoxy resin, glass, sol-gel, aerogel, and/or an optically stable polymer.

In still further embodiments of the present invention, the second encapsulation layer is substantially transparent.

In still further embodiments of the present invention, the second nanoparticles comprise $TiO_2$, diamond, silicon carbide, scattering particles, fillers, phosphors, and/or light conversion materials.

In still further embodiments of the present invention, the at least one physical property of the second encapsulation layer comprises index of refraction, thermal conductivity, mechanical strength, abrasion resistance, and/or optical stability.

In still further embodiments of the present invention, an outer surface of the first encapsulation layer, opposite the active region, may be shaped so that light rays from the active region are not incident on the first encapsulation layer at an angle that is greater than a critical angle.

Although described primarily above with respect to device embodiments of the present invention, it will be understood that the present invention may also be embodied as fabrication methods of forming light-emitting devices.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1A:
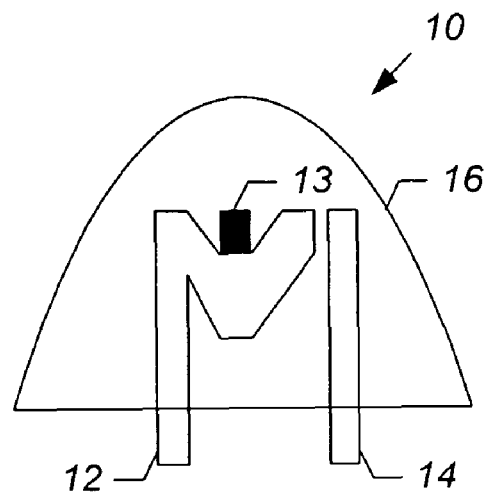
FIGS. 1A-1B are cross-sectional diagrams that illustrate light-emitting devices and fabrication methods therefor, in accordance with some embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. Each embodiment described herein also includes its complementary conductivity type embodiment.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first region, layer or section discussed below could be termed a second region, layer or section, and, similarly, a second without departing from the teachings of the present invention.

Embodiments of the present invention will now be described, generally, with reference to GaN-based light-emitting diodes (LEDs) on SiC-based or sapphire ($Al_2O_3$)-based substrates. The present invention, however, is not limited to such strictures. Examples of light-emitting devices that may be used in embodiments of the present invention include, but are not limited to, LEDs and/or laser diodes, such as devices manufactured and sold by Cree, Inc. of Durham, N.C. For example, the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in U.S. patent application Ser. No. 10/140,796, entitled "GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES", filed May 7, 2002, as well as U.S. patent application Ser. No. 10/057,821, filed Jan. 25, 2002 entitled "LIGHT EMITTING DIODES INCLUDING SUBSTRATE MODIFICATIONS FOR LIGHT EXTRACTION AND MANUFACTURING METHODS THEREFOR" the disclosures of which are incorporated herein as if set forth fully. Furthermore, phosphor coated LEDs, such as those described in U.S. patent application Ser. No. 10/659,241 entitled "PHOSPHOR— COATED LIGHT EMITTING DIODES INCLUDING TAPERED SIDEWALLS, AND FABRICATION METHODS THEREFOR," filed Sep. 9, 2003, the disclosure of which is incorporated by reference herein as if set forth full, may also be suitable for use in embodiments of the present invention.

The LEDs and/or lasers may be configured to operate in a "flip-chip" configuration such that light emission occurs through the substrate. In such embodiments, the substrate may be patterned so as to enhance light output of the devices as is described, for example, in U.S. patent application Ser. No. 10/057,821, filed Jan. 25, 2002 entitled "LIGHT EMITTING DIODES INCLUDING SUBSTRATE MODIFICATIONS FOR LIGHT EXTRACTION AND MANUFACTURING METHODS THEREFOR" the disclosure of which is incorporated herein by reference as if set forth fully herein.

Figure 1B:
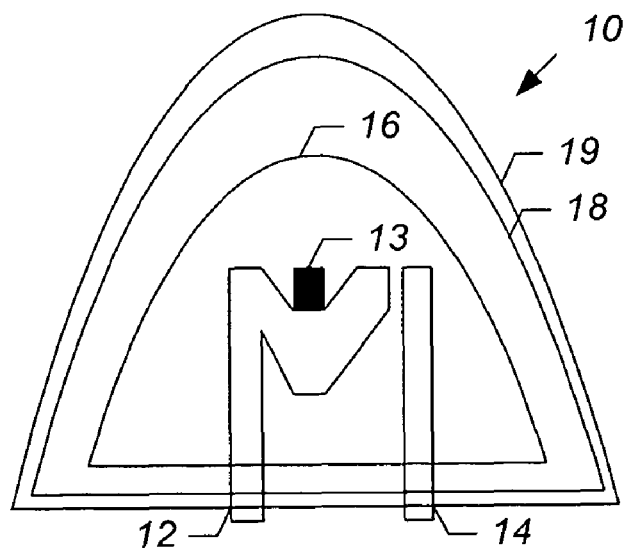

FIGS. 1A-1B are cross-sectional diagrams that illustrate light-emitting devices and fabrication methods therefor, in accordance with some embodiments of the present invention. Referring now to FIG. 1A, a light-emitting device 10, in accordance with some embodiments of the present invention, includes an LED, which includes an anode terminal 12, an active region 13, such as a diode region, and a cathode terminal 14, which are electrically coupled to one another. The active region 13 is configured to emit light responsive to a voltage applied thereto via, for example, the anode and cathode terminals 12 and 14. The light-emitting device 10 further includes a first encapsulation layer 16, which includes, for example, a matrix material and nanoparticles that modify at least one physical property, such as, for example, index of refraction, thermal conductivity, mechanical strength, abrasion resistance, and/or optical stability of the first encapsulation layer 16. The first encapsulation layer 16 at least partially encapsulates the active region in accordance with some embodiments of the present invention and may be substantially transparent. In accordance with various embodiments of the present invention, the matrix material may comprise silicone, a silicone compound, an optical gel, epoxy resin, glass, sol-gel, aerogel, and/or an optically stable polymer. Advantageously, the silicone gel is generally optically stable when exposed to relatively high flux, short wavelength light (e.g., on the order of 525 nm). The nanoparticles in the first encapsulation layer 16 may comprise $TiO_2$, diamond, silicon carbide, scattering particles, fillers, phosphors, and/or light conversion materials. Thus, for example, the first encapsulation layer 16 may comprise a silicone gel having $TiO_2$ nanoparticles contained therein. The $TiO_2$ nanoparticles contained in the silicone gel may increase the index of refraction of the first encapsulation layer 16 to allow the index of refraction of the first encapsulation layer 16 to more closely match the index of refraction of the active region 13 thereby improving light extraction from the active region 13.

When light travels from one medium to another, it may be refracted such that the angle of refraction is governed by Snell's law as follows: $n_1 \sin \theta_1 = n_2 \sin \theta_2$, where $n_1$ is the index of refraction for medium 1 and $n_2$ is the index of refraction for medium 2. The light that escapes, however, has an angular dependence that is less than the "critical angle," which is defined as follows $\theta_{1critical} = \sin^{-1}(n_2/n_1)$. Light that is incident at an angle greater than the critical angle does not pass through to medium 2, but is instead reflected back into medium 1. This reflection is commonly called total internal reflection. To further improve light extraction from the first encapsulation layer 16, an outer surface of the first encapsulation layer 16, opposite the active region 13, may be shaped so that light rays from the active region 13 are not incident on the first encapsulation layer 16 at an angle that is greater than the critical angle, in accordance with some embodiments of the present invention.

Referring now to FIG. 1B, the first encapsulation layer 16 is at least partially encapsulated with a second encapsulation layer 18, which may comprise a second matrix material and second nanoparticles that modify at least one physical property, such as, for example, index of refraction, thermal conductivity, mechanical strength, abrasion resistance, and/or optical stability of the second encapsulation layer 18. The second encapsulation layer 18 and may be substantially transparent. In accordance with various embodiments of the present invention, the second matrix material may comprise silicone, a silicone compound, an optical gel, epoxy resin, glass, sol-gel, aerogel, and/or an optically stable polymer. The second nanoparticles may comprise $TiO_2$, diamond, silicon carbide, scattering particles, fillers, phosphors, and/or light conversion materials.

In particular embodiments of the present invention, the second encapsulation layer 18 may include epoxy, plastic, and/or glass to add rigidity to the packaging of the light-emitting device 10. To improve the thermal characteristics of the packaging, a third encapsulation layer 19, which may be substantially transparent, may be used to at least partially encapsulate the second encapsulation layer 18 in accordance with some embodiments of the present invention. The third encapsulation layer 19 may include a thermally conductive material. In accordance with particular embodiments of the present invention, the first, second, and third encapsulation layers 16, 18, and 19 may be formed using a casting process.

Figure 2A:
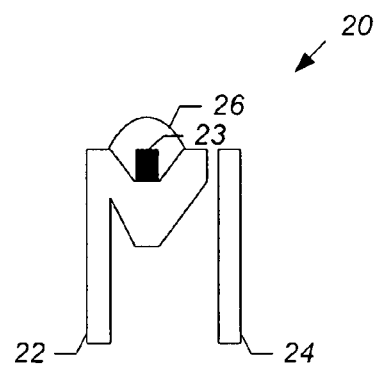
FIGS. 2A-2C are cross-sectional diagrams that illustrate light-emitting devices and fabrication methods therefor, in accordance with additional embodiments of the present invention.
Figure 2B:
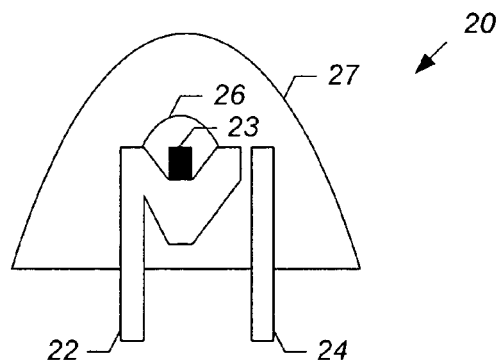
Figure 2C:
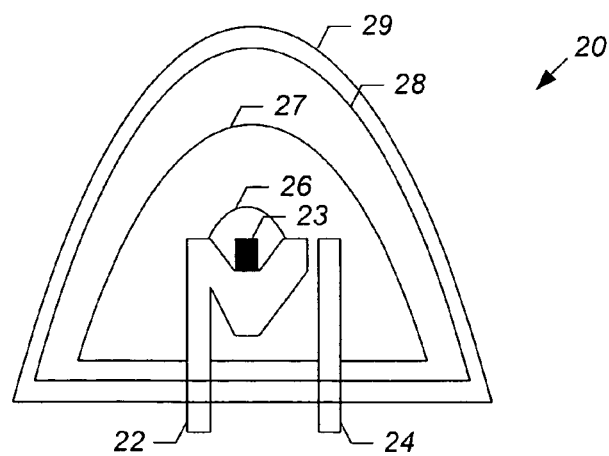

FIGS. 2A-2C are cross-sectional diagrams that illustrate light-emitting devices and fabrication methods therefor, in accordance with further embodiments of the present invention. Referring now to FIG. 2A, a light-emitting device 20, in accordance with some embodiments of the present invention, includes an LED, which includes an anode terminal 22, an active region 23, such as a diode region, and a cathode terminal 24, which are electrically coupled to one another. The active region 23 is configured to emit light responsive to a voltage applied thereto via, for example, the anode and cathode terminals 22 and 24. The light-emitting device 20 further includes a first encapsulation layer 26, which includes, for example, a matrix material and nanoparticles that modify at least one physical property, such as, for example, index of refraction, thermal conductivity, mechanical strength, abrasion resistance, and/or optical stability of the first encapsulation layer 26. The first encapsulation layer 26 at least partially encapsulates the active region in accordance with some embodiments of the present invention and may be substantially transparent. In accordance with various embodiments of the present invention, the matrix material may comprise silicone, a silicone compound, an optical gel, epoxy resin, glass, sol-gel, aerogel, and/or an optically stable polymer. The nanoparticles in the first encapsulation layer 26 may comprise $TiO_2$, diamond, silicon carbide, scattering particles, fillers, phosphors, and/or light conversion materials. Thus, for example, the first encapsulation layer 26 may comprise silicone gel, epoxy, and/or a polymer having $TiO_2$ nanoparticles contained therein. The $TiO_2$ nanoparticles contained in the matrix material may increase the index of refraction of the first encapsulation layer 26 to allow the index of refraction of the first encapsulation layer 26 to more closely match the index of refraction of the active region 23 thereby improving light extraction from the active region 23.

To further improve light extraction from the first encapsulation layer 26, an outer surface of the first encapsulation layer 26, opposite the active region 23, may be shaped so that light rays from the active region 23 are not incident on the first encapsulation layer 26 at an angle that is greater than the critical angle, in accordance with some embodiments of the present invention. In addition, the first encapsulation layer 26 may further include phosphor particles, to fabricate, for example, a white LED lamp, in accordance with some embodiments of the present invention. In accordance with particular embodiments of the present invention, the first encapsulation layer 26 may be formed using a casting or dispensing process.

Referring now to FIG. 2B, the light-emitting device 20 further comprises a second encapsulation layer 27 that at least partially encapsulates the first encapsulation layer 26 and may be substantially transparent. The second encapsulation layer 27 may comprise a second matrix material and second nanoparticles that modify at least one physical property, such as, for example, index of refraction, thermal conductivity, mechanical strength, abrasion resistance, and/or optical stability of the second encapsulation layer 27. In accordance with various embodiments of the present invention, the second matrix material may comprise silicone, a silicone compound, an optical gel, epoxy resin, glass, sol-gel, aerogel, and/or an optically stable polymer. The second nanoparticles may comprise $TiO_2$, diamond, silicon carbide, scattering particles, fillers, phosphors, and/or light conversion materials. Thus, in particular embodiments of the present invention, the second encapsulation layer 27 may comprise silicone gel.

Referring now to FIG. 2C, the second encapsulation layer 27 is at least partially encapsulated with a third encapsulation layer 28, which may be substantially transparent and may comprise a third matrix material and third nanoparticles that modify at least one physical property, such as, for example, index of refraction, thermal conductivity, mechanical strength, abrasion resistance, and/or optical stability of the third encapsulation layer 28. In accordance with various embodiments of the present invention, the third matrix material may comprise silicone, a silicone compound, an optical gel, epoxy resin, glass, sol-gel, aerogel, and/or an optically stable polymer. The third nanoparticles may comprise $TiO_2$, diamond, silicon carbide, scattering particles, fillers, phosphors, and/or light conversion materials.

In particular embodiments of the present invention, the third encapsulation layer 28 may include epoxy, plastic, and/or glass to add rigidity to the packaging of the light-emitting device 20. To improve the thermal characteristics of the packaging, a fourth encapsulation layer 29 may be used to at least partially encapsulate the third encapsulation layer 28 in accordance with some embodiments of the present invention. The fourth encapsulation layer 29 may include a thermally conductive material and may be substantially transparent. In accordance with particular embodiments of the present invention, the second, third, and fourth encapsulation layers 27, 28, and 29 may be formed using a casting process.

Figure 3A:
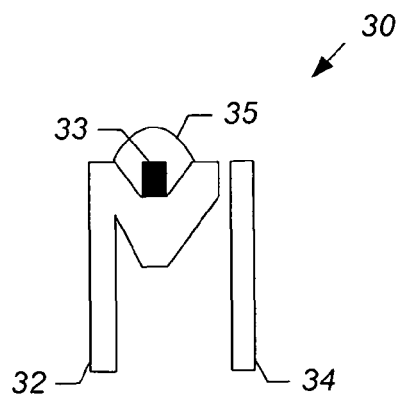
FIGS. 3A-3D are cross-sectional diagrams that illustrate light-emitting devices and fabrication methods therefor, in accordance with additional embodiments of the present invention.

FIGS. 3A-3D are cross-sectional diagrams that illustrate light-emitting devices and fabrication methods therefor, in accordance with some other embodiments of the present invention. Referring now to FIG. 3A, a light-emitting device 30, in accordance with some embodiments of the present invention, includes an LED, which includes an anode terminal 32, an active region 33, such as a diode region, and a cathode terminal 34, which are electrically coupled to one another. The active region 33 is configured to emit light responsive to a voltage applied thereto via, for example, the anode and cathode terminals 32 and 34. The light-emitting device 30 further includes a first encapsulation layer 35, which includes, for example, a matrix material and nanoparticles that modify at least one physical property, such as, for example, index of refraction, thermal conductivity, mechanical strength, abrasion resistance, and/or optical stability of the first encapsulation layer 35. The first encapsulation layer 35 at least partially encapsulates the active region and may be substantially transparent in accordance with some embodiments of the present invention. In accordance with various embodiments of the present invention, the matrix material may comprise silicone, a silicone compound, an optical gel, epoxy resin, glass, sol-gel, aerogel, and/or an optically stable polymer. The nanoparticles in the first encapsulation layer 35 may comprise $TiO_2$, diamond, silicon carbide, scattering particles, fillers, phosphors, and/or light conversion materials. Thus, for example, the first encapsulation layer 35 may comprise silicone gel, epoxy, and/or a polymer having $TiO_2$ nanoparticles contained therein. The $TiO_2$ nanoparticles contained in the matrix material may increase the index of refraction of the first encapsulation layer 36 to allow the index of refraction of the first encapsulation layer 35 to more closely match the index of refraction of the active region 35 thereby improving light extraction from the active region 33.

To further improve light extraction from the first encapsulation layer 35, an outer surface of the first encapsulation layer 35, opposite the active region 33, may be shaped so that light rays from the active region 33 are not incident on the first encapsulation layer 35 at an angle that is greater than the critical angle, in accordance with some embodiments of the present invention.

Figure 3B:
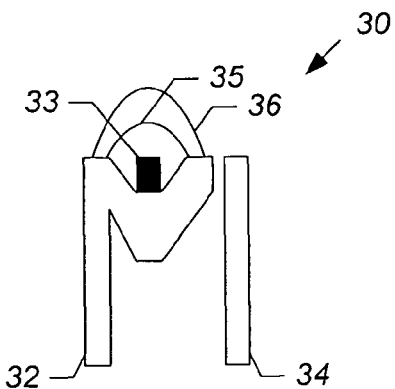

Referring now to FIG. 3B, the light-emitting device 30 further comprises a second encapsulation layer 36 that at least partially encapsulates the first encapsulation layer 35 and may be substantially transparent. The second encapsulation layer 36 may comprise a second matrix material and second nanoparticles that modify at least one physical property, such as, for example, index of refraction, thermal conductivity, mechanical strength, abrasion resistance, and/or optical stability of the second encapsulation layer 36. In accordance with various embodiments of the present invention, the second matrix material may comprise silicone, a silicone compound, an optical gel, epoxy resin, glass, sol-gel, aerogel, and/or an optically stable polymer. The second nanoparticles may comprise $TiO_2$, diamond, silicon carbide, scattering particles, fillers, phosphors, and/or light conversion materials. Thus, in particular embodiments of the present invention, the second encapsulation layer 36 may comprise silicone gel, epoxy, and/or a polymer having phosphor particles contained therein to fabricate, for example, a white LED lamp, in accordance with some embodiments of the present invention. In addition, the second encapsulation layer 36 may further include $TiO_2$ nanoparticles in accordance with some embodiments of the present invention. Advantageously, by separating the second encapsulation layer 36 from the active region 33, increased light output may be obtained from the light-emitting device. In accordance with particular embodiments of the present invention, the first and second encapsulation layers 35 and 36 may be formed using a casting or dispensing process.

Figure 3C:
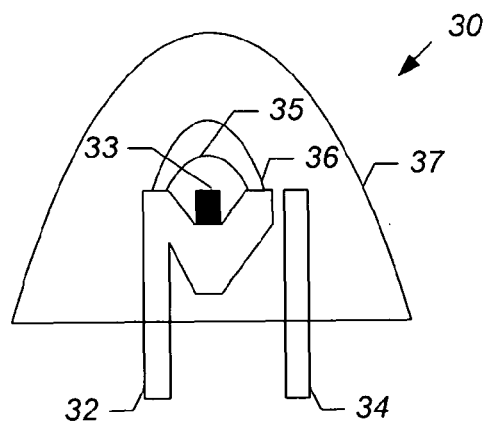

Referring now to FIG. 3C, the light-emitting device 30 further comprises a third encapsulation layer 37, that at least partially encapsulates the second encapsulation layer 36 and may be substantially transparent. The third encapsulation layer 37 may comprise a third matrix material and third nanoparticles that modify at least one physical property, such as, for example, index of refraction, thermal conductivity, mechanical strength, abrasion resistance, and/or optical stability of the third encapsulation layer 37. In accordance with various embodiments of the present invention, the third matrix material may comprise silicone, a silicone compound, an optical gel, epoxy resin, glass, sol-gel, aerogel, and/or an optically stable polymer. The third nanoparticles may comprise $TiO_2$, diamond, silicon carbide, scattering particles, fillers, phosphors, and/or light conversion materials. Thus, in particular embodiments of the present invention, the third encapsulation layer 37 may comprise silicone gel.

Figure 3D:
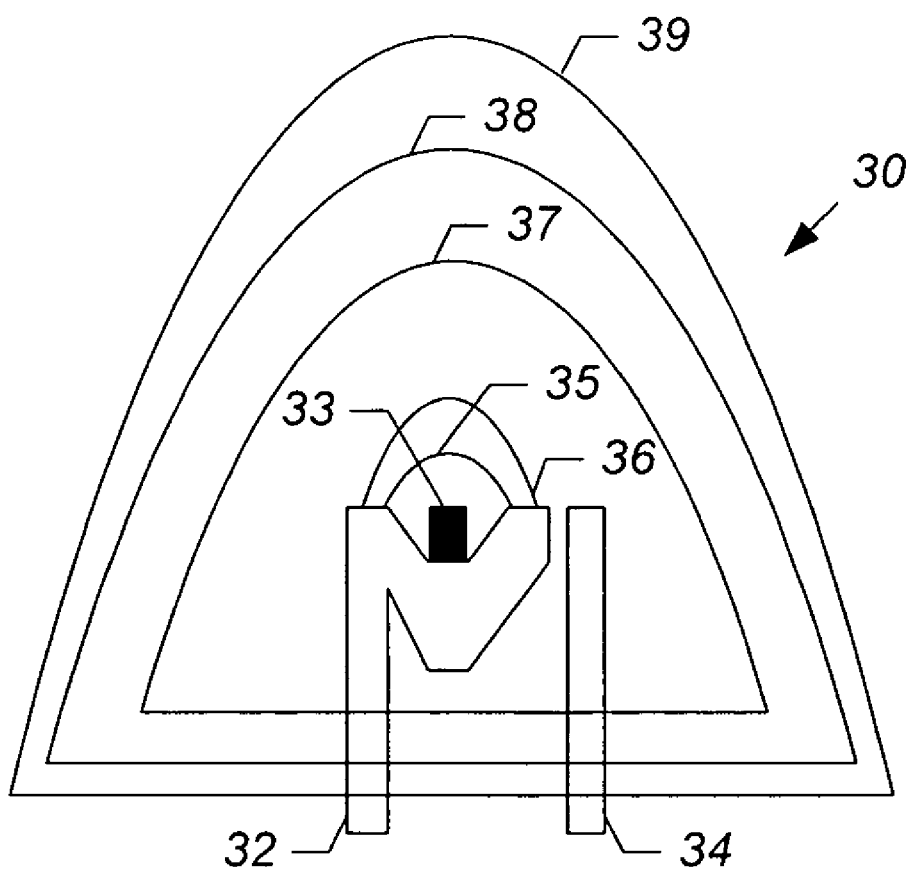

Referring now to FIG. 3D, the third encapsulation layer 37 is at least partially encapsulated with a fourth encapsulation layer 38, which may be substantially transparent and may comprise a fourth matrix material and fourth nanoparticles that modify at least one physical property, such as, for example, index of refraction, thermal conductivity, mechanical strength, abrasion resistance, and/or optical stability of the fourth encapsulation layer 38. In accordance with various embodiments of the present invention, the fourth matrix material may comprise silicone, a silicone compound, an optical gel, epoxy resin, glass, sol-gel, aerogel, and/or an optically stable polymer. The fourth nanoparticles may comprise $TiO_2$, diamond, silicon carbide, scattering particles, fillers, phosphors, and/or light conversion materials.

In particular embodiments of the present invention, the fourth encapsulation layer 38 may include epoxy, plastic, and/or glass to add rigidity to the packaging of the light-emitting device 30. To improve the thermal characteristics of the packaging, a fifth encapsulation layer 39 may be used to at least partially encapsulate the fourth encapsulation layer 38 in accordance with some embodiments of the present invention. The fifth encapsulation layer 39 may include a thermally conductive material and may be substantially transparent. In accordance with particular embodiments of the present invention, the third, fourth, and fifth encapsulation layers 37, 38, and 39 may be formed using a casting process.

In general, embodiments of the invention may comprise a sequence of multiple (two or more) encapsulation layers, each either fully or partially encapsulating the previous layers or light-emitting device. Each encapsulation layer may comprise one of a variety of matrix, nanoparticle, additive/filler materials as described above, and each layer may serve a specific complimentary function to improve the performance of the resulting package. It is generally desirable that the encapsulation layers do not substantially absorb light from the light-emitting device. Moreover, the interface between the encapsulation layers may be designed to enhance the optical and/or chemical properties. Compatibility of chemical and other physical properties, such as chemical reactions, adhesion, thermal expansion, etc. may place constraints upon the geometry and/or the configuration of the interface between various encapsulation layers.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A light-emitting device, comprising:
   an active region that is configured to emit light responsive to a voltage applied thereto;
   a first encapsulation layer that at least partially encapsulates the active region, the first encapsulation layer comprising a first matrix material and first nanoparticles and serving a first encapsulation layer function; and
   a second encapsulation layer that at least partially encapsulates the first encapsulation layer, the second encapsulation layer comprising a second matrix material and second nanoparticles and serving a second encapsulation layer function that is different from the first encapsulation layer function;
   wherein the first nanoparticles modify a first property that is a physical property of the first encapsulation layer including at least one of light scattering, diffraction, thermal conductivity, mechanical strength, abrasion resistance, and optical stability,
   wherein the second nanoparticles modify a second property that is a physical property of the second encapsulation layer including at least one of light scattering, diffraction, thermal conductivity, mechanical strength, abrasion resistance, and optical stability that is different from the first property.

2. The light-emitting device of claim 1,
   wherein the first matrix material comprises at least one of silicone, a silicone compound, an optical gel, epoxy resin, glass, sol-gel, aerogel, and an optically stable polymer, and
   wherein the second matrix material comprises at least one of silicone, a silicone compound, an optical gel, epoxy resin, glass, sol-gel, aerogel, and an optically stable polymer.

3. The light-emitting device of claim 1, wherein the first encapsulation layer and the second encapsulation layer are substantially transparent.

4. The light-emitting device of claim 1,
wherein the first nanoparticles comprise $TiO_2$, diamond, silicon carbide, scattering particles, fillers, phosphors, and/or light conversion materials, and
wherein the second nanoparticles comprise $TiO_2$, diamond, silicon carbide, scattering particles, fillers, phosphors, and/or light conversion material.

5. The light-emitting device of claim 1, wherein an outer surface of the first encapsulation layer, opposite the active region, is shaped so that light rays from the active region are not incident on the first encapsulation layer at an angle that is greater than a critical angle.

6. The light-emitting device of claim 1, wherein the first encapsulation layer physical property comprises light scattering, and
wherein the second encapsulation layer physical property comprises thermal conductivity.

7. The light-emitting device of claim 1, wherein the first encapsulation layer physical property comprises diffraction, and
wherein the second encapsulation layer physical property comprises light scattering.

8. The light-emitting device of claim 1, wherein the first encapsulation layer comprises phosphors, and
wherein the second encapsulation layer comprises light conversion materials.

9. The light-emitting device of claim 1, wherein the first nanoparticles comprise $TiO_2$, and
wherein the second nanoparticles comprise scattering particles.

10. The light-emitting device of claim 1, further comprising a third encapsulation layer that at least partially encapsulates the second encapsulation layer, the third encapsulation layer comprising a third matrix material and third nanoparticles and serving a third encapsulation layer function that modifies a third encapsulation layer physical property;
wherein the third encapsulation layer physical property comprises at least one of a third physical property of light scattering, diffraction, thermal conductivity, mechanical strength, abrasion resistance, and optical stability,
wherein the third encapsulation layer function is different from the first encapsulation layer function and the second encapsulation layer function, and
wherein the third nanoparticles comprise at least one of $TiO_2$, diamond, silicon carbide, scattering particles, fillers, phosphors, and light conversion materials.

11. A method of forming a light-emitting device, comprising:
forming an active region that is configured to emit light responsive to a voltage applied thereto;
forming a first encapsulation layer that at least partially encapsulates the active region, the first encapsulation layer comprising a first matrix material and first nanoparticles and serving a first encapsulation layer function that modifies a first encapsulation layer physical property; and
forming a second encapsulation layer that at least partially encapsulates the first encapsulation layer, the second encapsulation layer including a second matrix material and second nanoparticles and serving a second encapsulation layer function that modifies a second encapsulation layer physical property,
wherein the first encapsulation layer function is different from the second encapsulation layer function,
wherein the first encapsulation layer physical property comprises a first physical property of light scattering, diffraction, thermal conductivity, mechanical strength, abrasion resistance, and optical stability, and
wherein the second encapsulation layer property comprises a second physical property of light scattering, diffraction, thermal conductivity, mechanical strength, abrasion resistance, and optical stability that is different from the first property.

12. The method of claim 11, wherein the first matrix material comprises at least one of silicone, a silicone compound, an optical gel, epoxy resin, glass, sol-gel, aerogel, and an optically stable polymer,
wherein the second matrix material comprises at least one of silicone, a silicone compound, an optical gel, epoxy resin, glass, sol-gel, aerogel, and an optically stable polymer.

13. The method of claim 11, wherein the first encapsulation layer and the second encapsulation layer are substantially transparent.

14. The method of claim 11, wherein the first nanoparticles comprise at least one of $TiO_2$, diamond, silicon carbide, scattering particles, fillers, phosphors, and light conversion materials,
wherein the second nanoparticles comprise at least one of $TiO_2$, diamond, silicon carbide, scattering particles, fillers, phosphors, and light conversion material.

15. The method of claim 11, wherein an outer surface of the first encapsulation layer, opposite the active region, is shaped so that light rays from the active region are not incident on the first encapsulation layer at an angle that is greater than a critical angle.

16. The method of claim 11, wherein the first encapsulation layer physical property includes light scattering, and
wherein the second encapsulation layer physical property includes thermal conductivity.

17. The method of claim 11, wherein the first encapsulation layer physical property includes diffraction, and
wherein the second encapsulation layer physical property includes light scattering.

18. The method of claim 11, wherein the first encapsulation layer includes phosphors, and
wherein the second encapsulation layer includes light conversion materials.

19. The method of claim 11, wherein the first nanoparticles include $TiO_2$, and
wherein the second nanoparticles include scattering particles.

20. The method of claim 11, further comprising forming a third encapsulation layer that at least partially encapsulates the second encapsulation layer, the third encapsulation layer including a third matrix material and third nanoparticles and serve a third encapsulation layer function that modifies a third encapsulation layer physical property;
wherein the third encapsulation layer physical property includes at least one of a third physical property of light scattering, diffraction, thermal conductivity, mechanical strength, abrasion resistance, and optical stability, and
wherein the third nanoparticles include at least one of $TiO_2$, diamond, silicon carbide, scattering particles, fillers, phosphors, and light conversion materials.

21. A light-emitting device, comprising:
an active region that is configured to emit light responsive to a voltage applied thereto;

a first encapsulation layer that at least partially encapsulates the active region, the first encapsulation layer comprising a first material and serving a first encapsulation layer function that modifies a first encapsulation layer physical property; and a second encapsulation layer that at least partially encapsulates the first encapsulation layer, the second encapsulation layer comprising a second material and serving a second encapsulation layer function that modifies a second encapsulation layer physical property, wherein the first encapsulation layer function is different from the second encapsulation layer function, wherein the first material modifies a physical property of the first encapsulation layer including at least one of light scattering, diffraction, thermal conductivity, mechanical strength, abrasion resistance, and optical stability, and wherein the second material modifies a physical property of the second encapsulation layer including at least one of a second physical property of light scattering, diffraction, thermal conductivity, mechanical strength, abrasion resistance, and optical stability.

22. The light emitting device of claim 21, wherein the first encapsulation layer physical property comprises a wavelength conversion property that converts a wavelength of light emitted from the active region, and wherein the second encapsulation physical property comprises a light scattering property that is operable to scatter light that is converted by the first encapsulation layer.

23. The light emitting device of claim 21, wherein the first material comprises a first matrix material and first nanoparticles that perform the first encapsulation layer function to modify the first encapsulation layer physical property.

24. The light emitting device of claim 21, wherein the second material comprises a second matrix material and second nanoparticles that perform the second encapsulation layer function to modify a second encapsulation layer physical property.

25. The light emitting device of claim 21, further comprising a third encapsulation layer that at least partially encapsulates the second encapsulation layer, the third encapsulation layer comprising a third material that performs a third encapsulation layer function that modifies a third encapsulation layer physical property, wherein the third encapsulation layer function is different from the first encapsulation layer function and the second encapsulation layer function, and wherein the third encapsulation layer physical property comprises a third physical property including at least one of light scattering, diffraction, thermal conductivity, mechanical strength, abrasion resistance, and optical stability.

26. The light emitting device of claim 21, wherein the first encapsulation layer physical property comprises a wavelength conversion property that converts a wavelength of light emitted from the active region, wherein the second encapsulation physical property comprises a light scattering property that is operable to scatter light that is converted by the first encapsulation layer, and wherein the third encapsulation physical property comprises a thermal conductivity property that is configured to transfer thermal energy from the first and second encapsulation layers.

27. The light emitting device of claim 26, wherein the third material comprises a third matrix material and third nanoparticles that perform the third encapsulation layer function to modify the third encapsulation layer physical property, wherein the third nanoparticles comprise at least one of $TiO_2$, diamond, silicon carbide, scattering particles, fillers, phosphors, and light conversion materials.

* * * * *